(12) United States Patent
Poelzl

(10) Patent No.: US 7,375,029 B2
(45) Date of Patent: May 20, 2008

(54) METHOD FOR FABRICATING CONTACT HOLES IN A SEMICONDUCTOR BODY AND A SEMICONDUCTOR STRUCTURE

(75) Inventor: Martin Poelzl, Ossiach (AT)

(73) Assignee: Infineon Technologies AG, Munich (DE)

( * ) Notice: Subject to any disclaimer, the term of this patent is extended or adjusted under 35 U.S.C. 154(b) by 77 days.

(21) Appl. No.: 11/287,500

(22) Filed: Nov. 25, 2005

(65) Prior Publication Data

US 2006/0141739 A1 Jun. 29, 2006

(30) Foreign Application Priority Data

Nov. 26, 2004 (DE) .................. 10 2004 057 237

(51) Int. Cl.
*H01L 21/4763* (2006.01)
*H01L 21/44* (2006.01)
*H01L 21/8242* (2006.01)

(52) U.S. Cl. .................. 438/637; 438/668; 438/243

(58) Field of Classification Search ............... 438/424, 438/637–640, 243, 668
See application file for complete search history.

(56) References Cited

U.S. PATENT DOCUMENTS

| | | | |
|---|---|---|---|
| 4,967,245 A | 10/1990 | Cogan et al. | |
| 5,132,238 A | 7/1992 | Murakami et al. | |
| 5,385,852 A * | 1/1995 | Oppermann et al. | 438/270 |
| 5,801,417 A | 9/1998 | Tsang et al. | |
| 6,753,228 B2 | 6/2004 | Azam et al. | |
| 6,903,416 B2 | 6/2005 | Henninger et al. | |
| 6,916,745 B2 * | 7/2005 | Herrick et al. | 438/700 |
| 2002/0008284 A1 | 1/2002 | Zeng | |
| 2004/0104428 A1 | 6/2004 | Henninger et al. | |

FOREIGN PATENT DOCUMENTS

| | | |
|---|---|---|
| DE | 40 42 163 C2 | 12/1994 |
| DE | 102 45 249 A1 | 4/2004 |
| JP | 03011765 A | 1/1991 |
| WO | WO 96/35231 A1 | 11/1996 |

\* cited by examiner

*Primary Examiner*—Chuong A. Luu
(74) *Attorney, Agent, or Firm*—Maginot, Moore & Beck

(57) ABSTRACT

A method for fabricating contact holes in a semiconductor body proceeds from a structure in which: a plurality of trenches isolated from one another by mesa regions are provided in the semiconductor body, and electrodes are provided in the trenches, which electrodes are electrically insulated from the semiconductor body by a first insulation layer, and the upper ends of which electrodes are situated at a deeper level than the upper ends of the trenches. The method comprises the steps of: producing a second insulation layer by subjecting parts of the surface of the structure to a thermal oxidation process, and carrying out a planarization process in such a way that the semiconductor body is uncovered in the region of the mesa regions, and forming the contact holes in the mesa regions using the residues of the second insulation layer remaining after the planarization process as a contact hole mask.

7 Claims, 4 Drawing Sheets

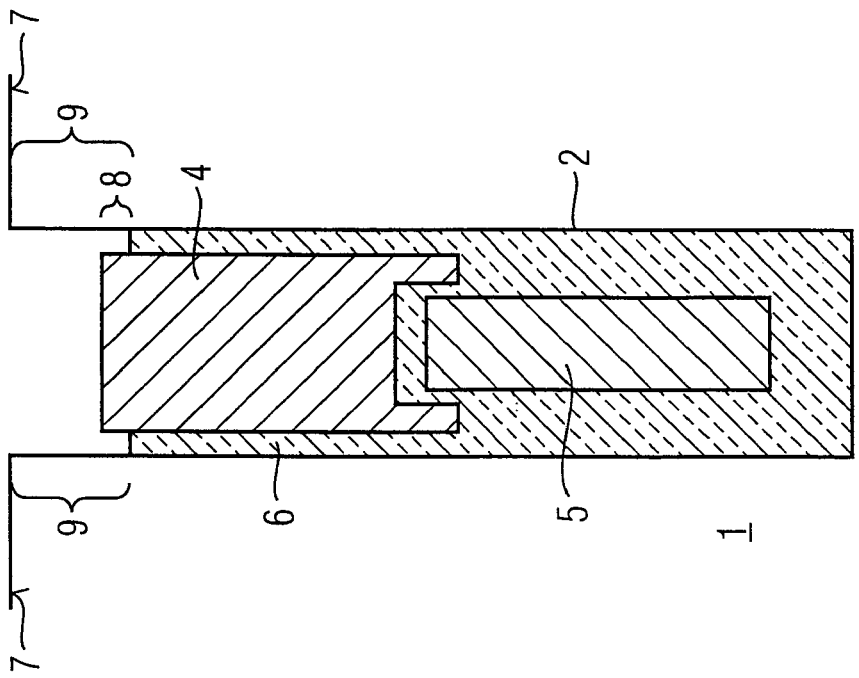
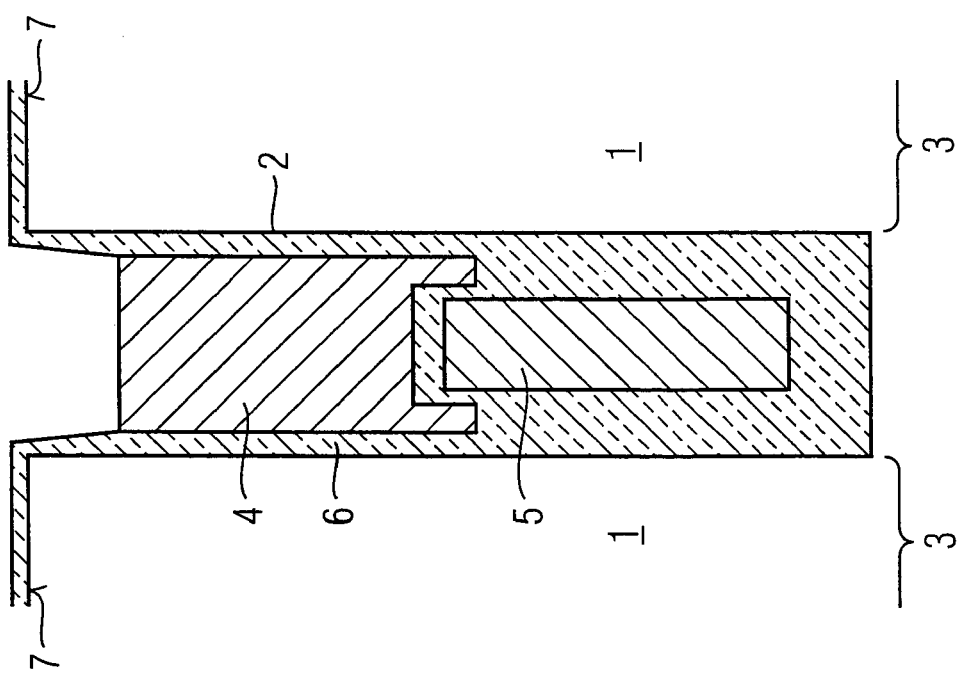

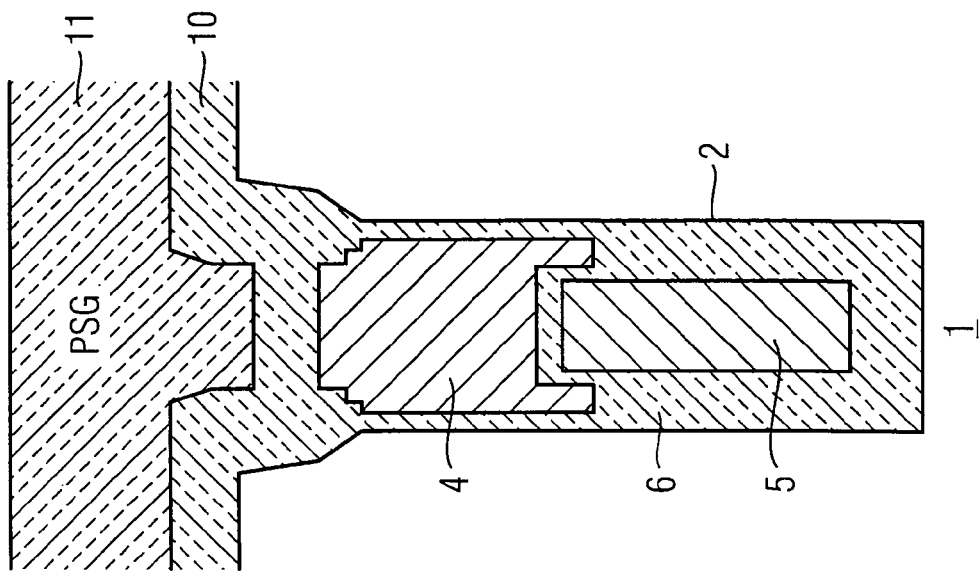
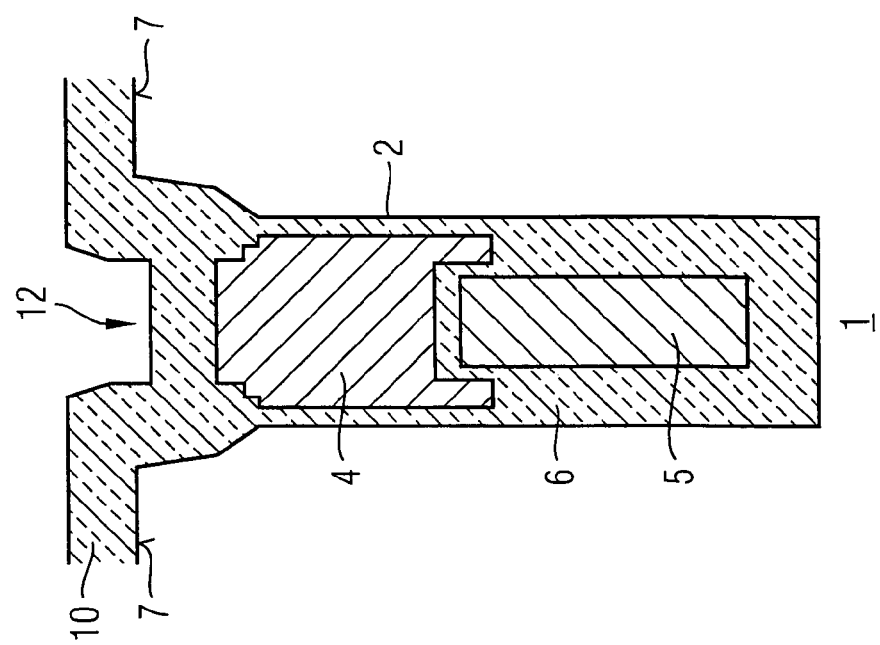

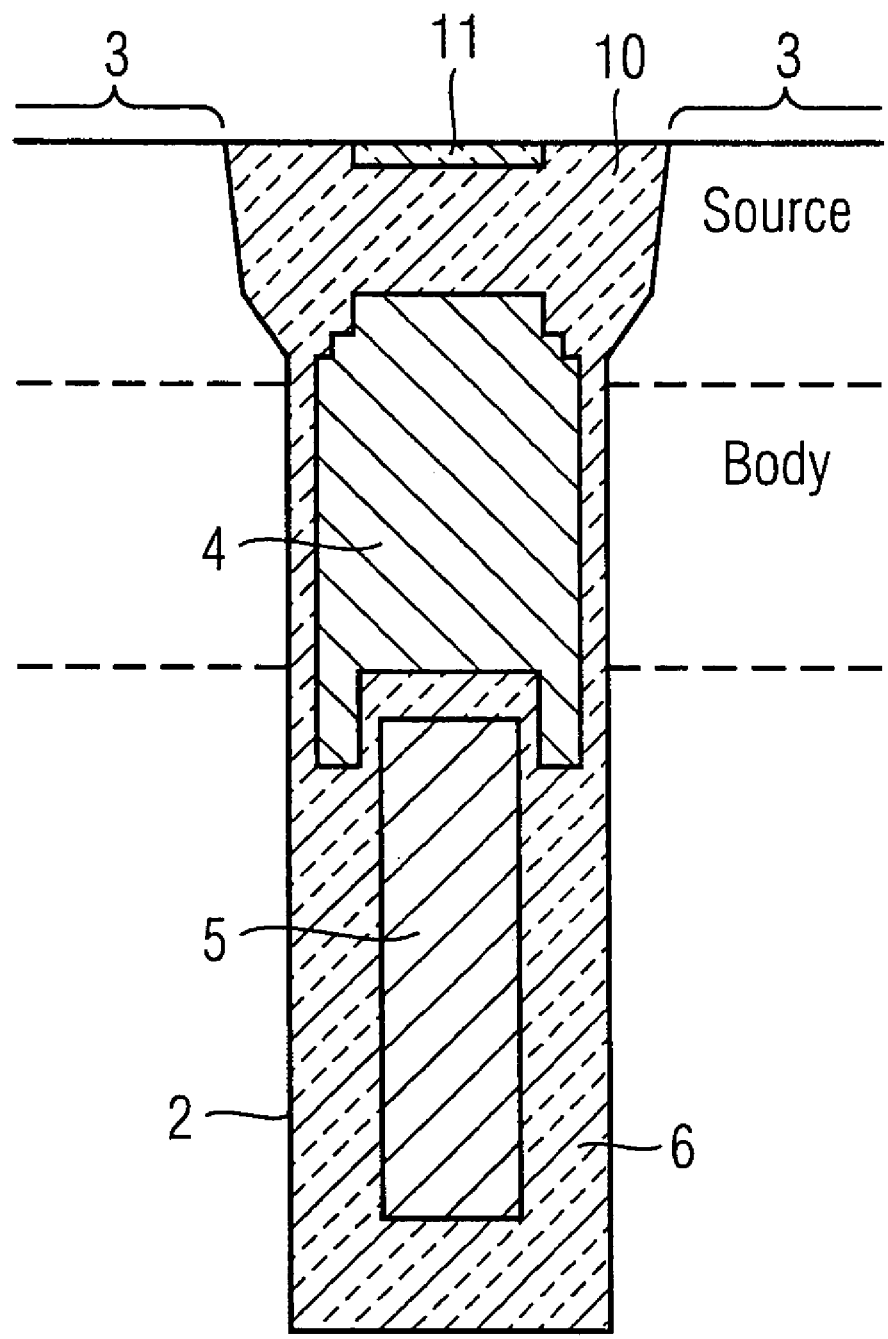

METHOD FOR FABRICATING CONTACT HOLES IN A SEMICONDUCTOR BODY AND A SEMICONDUCTOR STRUCTURE

FIELD OF THE INVENTION

The invention relates to semiconductor structures that include trenches isolated from one another by mesa regions in a semiconductor body.

BACKGROUND

The fabrication of large scale integrated semiconductor devices requires fabrication methods having small tolerance ranges. Thus, when fabricating trench transistors, by way of example, care must be taken to ensure that contact holes which are formed in mesa regions situated between the trenches (that part of the semiconductor body—in which the trenches are formed—which is situated between the trenches) are at a defined distance from the trenches. If this is not the case, then the threshold voltage of the trench transistor is subject to large fluctuations.

The fabrication of contact holes in mesa regions is generally effected using so-called "spacers". The spacers are fabricated before the formation of the contact holes and define the later spacing between the trenches and the contact holes to be fabricated. Several methods are taken into consideration:

In the document DE 40 42 163 C2 the spacers are fabricated using complicated masks.

In the document DE 102 45 249 A1 the spacers are fabricated using insulation structures which have to be produced separately.

In the document U.S. Pat. No. 5,385,852, the spacers required for producing the contact holes are produced using a trench mask.

In the document US 2002/0008284 A1, the spacers are produced by means of a mesa region etching-back process.

Furthermore, reference shall be made to the document U.S. Pat. No. 5,801,417, in which the spacers are fabricated using a hard mask.

The methods described above have the disadvantage that the tolerances which occurred during the fabrication of the spacers are relatively large. Moreover, masks are additionally required for fabricating the spacers.

SUMMARY

The object on which the invention is based is to specify a method for fabricating contact holes in mesa regions of a semiconductor body which is simple and the tolerances of which are as small as possible.

One method according to the invention for fabricating contact holes in a semiconductor body proceeds from a structure in which:

a plurality of trenches isolated from one another by mesa regions are provided in the semiconductor body, and electrodes are provided in the trenches, which electrodes are electrically insulated from the semiconductor body by a first insulation layer, and the upper ends of which electrodes are situated at a deeper level than the upper ends of the trenches, and has the following steps of:

producing a second insulation layer, which covers at least parts of the surface of the structure, by subjecting the surface of the structure to a thermal oxidation process, carrying out a planarization process in such a way that the semiconductor body is uncovered in the region of the mesa regions, and forming the contact holes in the mesa regions using the residues of the second insulation layer that have remained after the planarization process as a contact hole mask.

Preferably, before the thermal oxidation process is carried out, the upper region of the electrodes is uncovered (if this is not yet the case).

In this case "planarization" is understood to mean the removal of layers (e.g. by etching, grinding or polishing).

The method according to the invention enables a passive adjustment of the distance between the contact holes and the trenches. Consequently, a separate mask is not required for fabricating the contact holes. The inaccuracies associated with a mask of this type can be avoided; the tolerances of the thermal oxidation process are significantly smaller than the tolerances that the use of a separate mask would entail.

The second insulation layer produced by the thermal oxidation process functions on the one hand as a spacer between the contact holes and the trenches. On the other hand, the second insulation layer functions as insulation of the electrodes toward the top, for example with respect to a source metallization that is to be applied later.

In the description below, it shall be assumed by way of example that the electrodes within the trenches are gate electrodes of a trench transistor.

In order to ensure a sufficient insulation of the gate electrodes from the source metallization, in one preferred embodiment of the method according to the invention, after the formation of the second insulation layer, a third insulation layer is deposited on the second insulation layer (or over the entire surface of the structure produced up to that point). The third insulation layer fills residual free spaces within the trenches and thus provides for a better insulation between source metallization and gate electrodes.

The planarization process for uncovering the semiconductor body in the region of the mesa regions (to put it more precisely the horizontally running part of the surfaces of the mesa regions) may be for example a CMP process (Chemical Mechanical Polishing) and/or etching process. Parts of the second insulation layer and/or of the third insulation layer are removed by the planarization process.

The formation of the contact holes is preferably effected by means of an etching process, the etchant being a selective etchant in such a way that only the semiconductor body (the mesa regions) but not the second insulation layer is etched. Accordingly, a selective etching process is carried out, the residues of the second insulation layer that have remained after the planarization process serving as an etching mask.

The methods according to the invention can be used, in particular as part of a method for fabricating a semiconductor device, in particular a trench transistor, an IGBT, a Schottky diode and the like. The method according to the invention can be employed in principle whenever contact holes and trenches have to be produced in a manner spaced apart in defined fashion alongside one another.

The electrodes (gate electrodes) are preferably composed of a semiconducting material, since the surface of the gate electrodes can then also be converted into insulating material by means of the thermal oxidation process. The material of the electrodes may also be composed of a non-semiconducting material. In this case, a separate insulation has to be provided after or before the thermal oxidation process on the gate electrode. In one preferred embodiment, the semiconductor body is composed of monocrystalline silicon, and the gate electrodes are composed of polysilicon. However, the invention is not restricted thereto. By way of example, tungsten, Ti, titanium nitride, Cu or Al may be used.

The invention furthermore provides a semiconductor structure, having a semiconductor body, in which a plurality of trenches isolated from one another by mesa regions are provided, an electrode being provided in each of the trenches, which electrode is electrically insulated from its surroundings by a corresponding insulation, and the upper end of which electrode is situated at a deeper level than the upper end of the corresponding trench. Each of the trenches has an expanded portion in the upper region, said expanded portion being at least partly filled by the corresponding insulation. The lateral boundaries (ends) of the insulations are chosen such that the insulations can be utilized as a contact hole mask for forming contact holes in the mesa regions.

The semiconductor structure according to the invention has the advantage that the insulations which serve for insulating the electrodes provided in the trenches can simultaneously be utilized as spacer structures (spacing structures) for producing contact holes in the mesa regions. Since the insulations can be produced at least in part by means of a highly precise oxidation process, the contact holes can be positioned very accurately in the mesa regions.

The expanded portions preferably have a funnel-shaped or bowl-shaped form. Parts of the insulations which are situated above the electrodes may comprise a plurality of insulation layers.

In one preferred embodiment, the vertical position of the upper end of each electrode lies above the vertical position of the lower end of the corresponding funnel-shaped expanded portion.

The regions of the electrodes which are situated above the vertical position of the lower ends of the funnel-shaped expanded portions may in principle have any desired form. In a particularly preferred embodiment, the electrodes have in these regions non-upwardly-expanding forms that is to say for example upwardly tapering forms.

The electrodes may be configured in thinned fashion in the lower region of the trenches, in which case the upper thickened region and also the lower thinned region of an electrode may be merged to form a common unit. As an alternative, each electrode may be divided into a top electrode and a bottom electrode, which are insulated from one another, the bottom electrode being thinner than the top electrode. In this case, the top electrode serves as a gate electrode and the bottom electrode functions as a field plate (is preferably at source potential). The insulation in the lower region of the trenches is advantageously configured in thickened fashion.

The semiconductor structure may be, for example, a transistor having a vertical construction, a source region and a body region being formed in each mesa region. In this case, a contact hole for making contact with the source region and body region may advantageously be formed in each mesa region, the maximum lateral extent of said contact hole (at the surface of the mesa region) ending at the insulations of adjacent trenches (to put it more precisely, at the parts of insulations which adjoin the surface of the mesa regions). In order to ensure that good contact is made with the body region, a body contact region may be formed at least in the bottom region of each contact hole.

If the semiconductor structure is a transistor, then in one preferred embodiment the semiconductor body is of the first conduction type, the source region is of the first conduction type, the body region is of the second conduction type, and the body contact region is of the second conduction type.

BRIEF DESCRIPTION OF THE DRAWINGS

The invention is explained in more detail below in exemplary embodiment with reference to the figures, in which:

FIG. 1 shows a first process stage of one preferred embodiment of the fabrication method according to the invention in a cross-sectional illustration, FIG. 2 shows a second process stage of one preferred embodiment of the fabrication method according to the invention in a cross-sectional illustration, FIG. 3 shows a third process stage of one preferred embodiment of the fabrication method according to the invention in a cross-sectional illustration, FIG. 4 shows a fourth process stage of one preferred embodiment of the fabrication method according to the invention in a cross-sectional illustration, FIG. 5 shows a fifth process stage of one preferred embodiment of the fabrication method according to the invention in a cross-sectional illustration.

DETAILED DESCRIPTION

Figure 6:
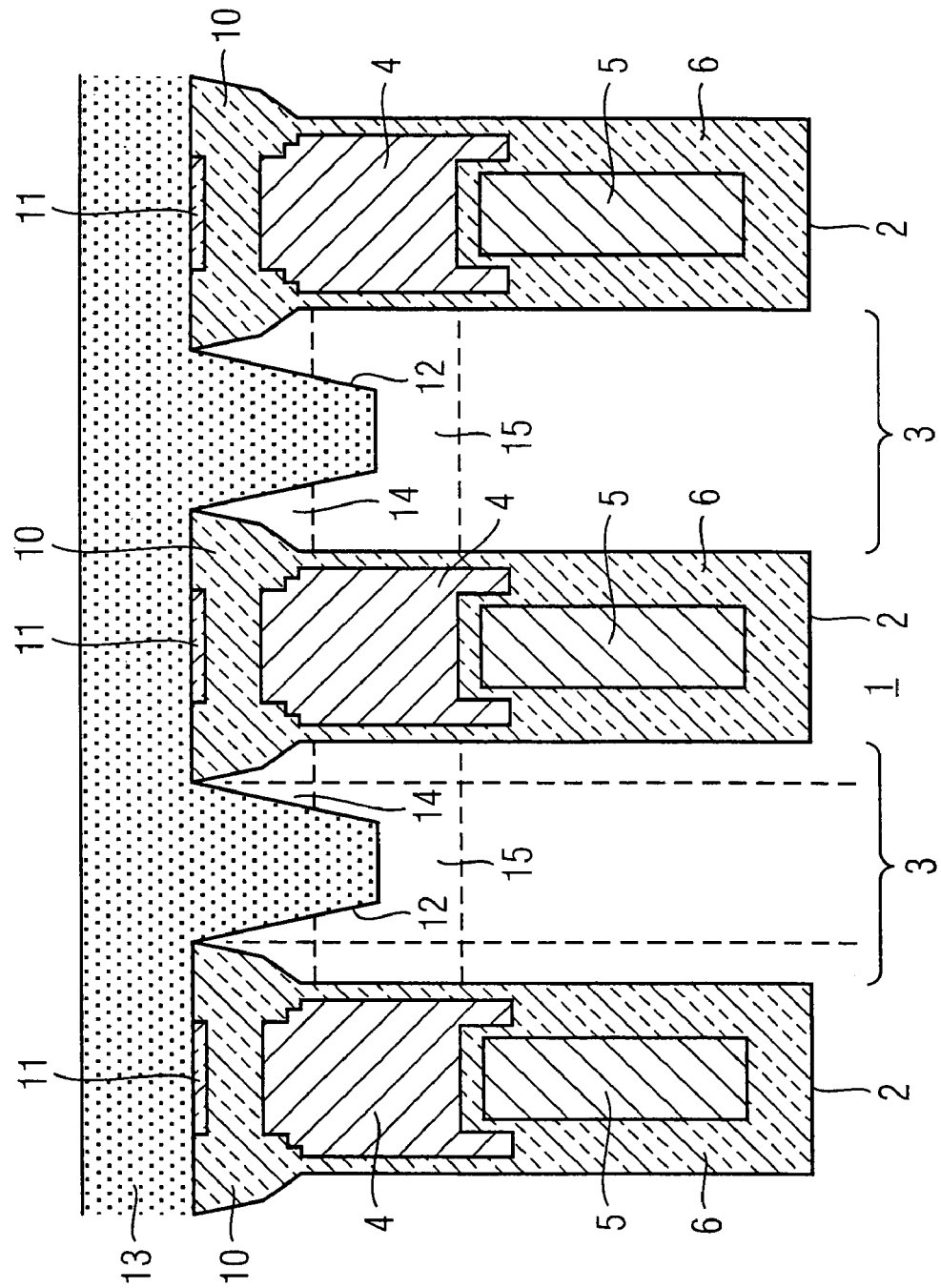
FIG. 6 shows a sixth process stage of one preferred embodiment of the fabrication method according to the invention in a cross-sectional illustration.

In the figures, identical or mutually corresponding regions, components or component groups are identified by the same reference numerals. Furthermore, in all of the embodiments, the doping types can be interchanged with one another, that is to say that n-type regions can be replaced by p-type regions, and vice versa.

FIG. 1 shows the initial stage of the fabrication method according to the invention. A structure having a semiconductor body 1 can be seen. A plurality of trenches (only one trench can be seen in FIG. 1) 2 are provided in the semiconductor body 1, the trenches 2 being isolated from one another by mesa regions 3. Gate electrodes 4 and source electrodes (electrodes at source potential) 5 are provided in the trenches 2. The source electrodes 5 are electrically insulated from the gate electrodes 4. The gate electrodes 4 and the source electrodes 5 are electrically insulated from the semiconductor body 1 by a first insulation layer 6, which is configured in thickened fashion in the lower region of the trenches 2, that is to say in the region of the source electrodes 5. The first insulation layer also covers the surfaces 7 of the mesa regions 3 in this process stage.

In the next process step (FIG. 2), the first insulation layer 2 is etched back right into the trenches 2. The etching depth is chosen such that an upper region 8 of each gate electrode 4 projects from corresponding residues of the first insulation layer 6 and is thus uncovered.

In the next process step (FIG. 3), the surface of the structure is subjected to a thermal oxidation process, the surface of the structure being understood to mean the surface which is composed of the surfaces of the mesa regions 7, the surfaces of the uncovered regions 9 of the inner walls of the trenches 2 and also the surfaces of the parts of the gate electrodes 4 which project from the residues of the first insulation layers 6. Parts of the mesa regions 3 and also parts of the upper regions 8 (the uncovered regions) of the gate electrodes 4 are converted into a second insulation layer 10 by means of the thermal oxidation process.

In a further process step (FIG. 4) a third insulation layer 11, for example phosphorus-doped silicate glass (PSG), undoped silicate glass (USG), TEOS (High Density Plasma Oxide), BPSG (Borophosphosilicate glass) or nitride is deposited on the surface of the second insulation layer 10. As a result of the application of the third insulation layer 11, free spaces 12 that remained within the trenches 2 are filled with insulating material.

In the next process step (FIG. 5) a planarization process is carried out (for example wet-chemical mechanical polishing and/or etching) whereby the surfaces 7 of the mesa regions 3 are caused to be uncovered. It is optionally possible also to effect deeper planarization. What is important that at least parts of the surfaces of residual mesa regions are caused to be uncovered. The source and body regions are formed in the upper regions of the mesa regions 3.

In the next process step (FIG. 6) contact holes 12 are formed in the mesa regions 3, which contact holes are subsequently filled with a conductive material 13, for example a metal. The conductive material 13 makes contact both with source regions 14 and with body regions 15. In this case, the second insulation layer 10 serves as a mask for forming the contact holes 12. By using the second insulation layer 10 as a mask for forming the contact holes 12, it is possible to achieve a very accurate relative positioning between the trenches 2 and the contact holes 12, since the reproducibility of the lateral extent of the second insulation layer 10 (produced by the thermal oxidation process) is very good.

Further aspects of the invention will be explained in more detail below. The method according to the invention enables the distance between trench and contact region to be set in a self-aligned manner. The aim is to enable maximum packing densities (minimum pitch) for power transistors.

At the present time aligned contact photo-planes are used for fabricating power transistors which is disadvantageous in this case in that the distance between trench and contact hole is subjected to the fluctuations of the phototechnology (CD dimension of the phototechnology, alignment tolerance of the phototechnology). These fluctuations limit the component scaling ("shrink roadmap") since the production of a body contact region (generally a $p^+$-type implantation) in the contact hole influences the threshold voltage of the component.

The document DE 40 42 163 C2makes use of a spacer technique which, in contrast to the invention, defines the spacers by means of a bowl etching (isotropic etching) prior to the trench etching. A complicated mask stack, which also has to be removed again in a complicated manner, is used for this purpose. Moreover, the bowl etching does not achieve the accuracy which can be achieved by the spacers used according to the invention. The gate electrodes provided in the trenches have a T-like form, the expanded portions (the bowls produced by the etching process) in the upper regions of the trenches being at least partly filled by the gate electrodes. The insulation layers which isolate the gate electrodes from the semiconductor body have a continuous layer thickness within the bowl regions.

According to the invention, the etching process for forming the bowls is not necessary since the bowls (the expanded portions, that is to say the V-shaped funnels) are produced by a thermal oxidation process, the bowls being filled with insulating material produced during the thermal oxidation process. Therefore, according to the invention, in contrast to what is disclosed in document DE 40 42 163 C2, the bowls are not filled by the upper part of T-shaped gate electrodes, but rather by insulating material. According to the invention, therefore, the gate electrodes do not have a T-shaped configuration, but preferably a rather plate-type form. The layer thickness of the insulation layer in the expanded portions is inhomogeneous according to the invention (after the planarization process has been carried out). A further difference is that, according to the invention, firstly the gate electrodes are produced within the trenches with walls running essentially perpendicular and then the expanded portions are produced, whereas this process proceeds the opposite way round in document DE 40 42 163 C2.

In the document DE 102 45 289 A1, the spacers are realized by means of pulling back the mesa. The fabrication process is again influenced by a plurality of process fluctuations (trench angle fluctuation, mesa etching-back, spacer TEOS thickness, etching fluctuations) that are avoided according to the invention. The trench insulations projecting from the mesa region which are described in this document are superfluous in the method according to the invention.

In the document U.S. Pat. No. 6,753,228 B2, a spacer is utilized in order to define the production of a body contact region ($p^+$-type implantation), in a self-aligned manner. This method is defined in connection with structures without trenches. Spacer width fluctuations which limit the component scaling (hard mask erosion during the trench etching, poly etching-back fluctuations, spacer oxide thickness and etching fluctuations) are disadvantageous.

In the document U.S. Pat. No. 5,385,852 a trench mask is used in order to produce a spacer by means of a local oxidation after a poly recess. What is disadvantageous in this case is that the field oxidation with hard mask nitride present leads to high stress and severe undercuts during subsequent field plate etching. It is furthermore disadvantageous that a complicated hard mask process beset by higher variations and a LOCOS oxidation (local oxidation using a nitride layer which partially suppresses the oxidation) are necessary.

In the document US 2002 0008284 A1a spacer is realized by means of a mesa etching-back. The disadvantages of the method are the same as the disadvantages described in connection with document DE 102 45 249 A1.

In the document U.S. Pat. No. 5,801,417 a spacer is realized by means of the trench hard mask. The described fabrication of a hard mask comprising oxide/poly/oxide stack and a spacer comprising TEOS is difficult to combine with a field plate concept as used in the SFET3 concept (two electrodes insulated from one another in the trench ("double poly")). The spacer would have to be removed during the field plate etching. Furthermore, the variations of the spacer end width are not negligible (three layers of the hard mask stack, spacer TEOS thickness and etching).

The invention proposes a process sequence which enables a self-alignment between trenches by utilizing a post-oxide process. At the same time, the post-oxide is used as optimum insulation oxide for insulation between gate and source metallization. The advantages of the method according to the invention are:

compatibility with the SFET3 process.

Minimum process variations of the spacer width by restricting the definition of the spacer width to minimum thickness fluctuations during a thermal oxidation.

The spacer-defining oxide can be used as gate insulation.

In the document DE 102 45 249 A1 the spacers are realized by means of pulling back the mesa. The fabrication process is again influenced by a plurality of process fluctuations (trench angle fluctuation, mesa etching-back, spacer TEOS thickness, etching fluctuations) that are avoided according to the invention. The trench insulations projecting from the mesa region which are described in this document are superfluous in the method according to the invention.

One essential aspect of the invention is the realization of a self-aligned trench contact (relative to a trench) with minimum spacer width fluctuations, which permits the highest possible packing densities (smallest possible pitches).

FIG. 1 corresponds to the process stage of the poly G recess in the SFET3 standard process. The gate recess is located approximately 200 nm deeper than the standard process in order to ensure later a sufficiently thick insulation with respect to the source metallization. The residual gate oxide is subsequently removed without any residues (FIG. 2).

A post-oxidation is effected next. In this key process, a post-oxide is grown with a thickness of approximately 200-300 nm. This consumes approximately 100-150 nm from the silicon (semiconductor body)—both in planar fashion and at the sidewall over the gate recess edge (FIG. 3). This form is used as a spacer hereafter. The gap over the trench is filled with intermediate oxide (FIG. 4). The intermediate oxide may be doped with phosphorus, boron, or else undoped and may be deposited by means of LPCVD processes (Low Pressure Chemical Vapor Deposition) or in plasma-enhanced fashion; HDP processes (High Density Plasma) are also conceivable. The etching-back is optionally effected purely anisotropically in an oxide etcher or in a combination of CMP and an oxide etcher (FIG. 5). The etching ends on the silicon surface of the mesa regions. The spacer edges define the distance between the trenches (FIG. 6). The trench etching is followed by the fabrication of a $p^+$-type contact (body contact region) and a trench filling (with polysilicon and AlSiCu or with a barrier made of "hot AlCu " (hot deposited AlCu)).

The advantages of the method according to the invention are:

Critical misalignment/CD requirements with regard to the contact hole plane are obviated.

The spacer can be set very accurately (fluctuations less than 15 nm) on account of the small oxide thickness fluctuations. It is thus possible to minimize the effects of the body contact regions on the threshold voltage.

The dielectric insulation with respect to the source metal by the post-oxide has a higher quality than the insulations produced by plasma processes which are used in the prior art.

The gate oxide is reinforced by the oxide produced by oxidation.

The method according to the invention is compatible in principle with SFET3-EDP (Electronic Data Processing (Motherboard, Notebook)).

The method according to the invention can also be applied to standard trenches or to field plate trenches with a common electrode (gate electrode and underlying source electrode are merged to form a common electrode).

What is claimed is:

1. A method for fabricating contact holes in a semiconductor body, the semiconductor body including a structure comprising a plurality of trenches, each trench of the plurality of trenches being isolated from other trenches of the plurality of trenches by mesa regions, each trench of the plurality of trenches including an electrode electrically insulated from the semiconductor body by a first insulation layer, an upper end of the electrode being situated at a deeper level than an upper end of the corresponding trench, the method comprising:

producing a second insulation layer, which covers at least parts of a surface of the structure, by subjecting the surface of the structure to a thermal oxidation process;

depositing a third insulation layer on the second insulation layer after the formation of the second insulation layer;

carrying out a CMP or an etching planarization process in such a way that the semiconductor body is uncovered in at least portions of the mesa regions, and whereby parts of the second insulation layer or of the third insulation layer are removed; and forming the contact holes in the mesa regions by using residues of the second insulation layer that have remained after the planarization process as a contact hole mask.

2. The method as claimed in claim 1, further comprising:

uncovering an upper region of the electrodes before the thermal oxidation process is carried out.

3. The method as claimed in claim 1, wherein the step of forming the contact holes in the mesa regions further comprises:

performing an etching process to form the contact holes, an etchant being selected such that only the semiconductor body and not the second insulation layer is etched.

4. The method as claimed in claim 1, wherein the method comprises intermediate steps of a method for fabricating a semiconductor device.

5. The method as claimed in claim 1, wherein the electrodes are composed of semiconducting material.

6. The method as claimed in claim 5, wherein the semiconductor body is composed of monocrystalline silicon, and the electrodes are composed of polysilicon.

7. The method as claimed in claim 1, wherein the electrodes comprise gate electrodes of a trench transistor.

* * * * *